(12) United States Patent
Phatak et al.

(10) Patent No.: US 10,891,759 B2
(45) Date of Patent: Jan. 12, 2021

(54) METHOD FOR LOSSLESS COMPRESSION AND REGENERATION OF DIGITAL DESIGN DATA

(71) Applicant: Amar Phatak, Mumbai (IN)

(72) Inventors: Amar Phatak, Mumbai (IN); Shashank Mewada, Mumbai (IN)

( * ) Notice: Subject to any disclaimer, the term of this patent is extended or adjusted under 35 U.S.C. 154(b) by 348 days.

(21) Appl. No.: 16/085,121

(22) PCT Filed: Mar. 23, 2016

(86) PCT No.: PCT/IB2016/051635
§ 371 (c)(1),
(2) Date: Sep. 14, 2018

(87) PCT Pub. No.: WO2017/163106
PCT Pub. Date: Sep. 28, 2017

(65) Prior Publication Data
US 2019/0073799 A1    Mar. 7, 2019

(51) Int. Cl.
*G06T 9/00* (2006.01)
*G06F 16/174* (2019.01)
*G06T 17/20* (2006.01)
*G06T 17/00* (2006.01)
*G06F 30/00* (2020.01)
*G06F 30/22* (2020.01)
*H03M 7/30* (2006.01)
*G06F 30/23* (2020.01)

(52) U.S. Cl.
CPC .......... *G06T 9/001* (2013.01); *G06F 16/1744* (2019.01); *G06F 30/00* (2020.01); *G06F 30/22* (2020.01); *G06T 17/00* (2013.01); *G06T 17/20* (2013.01); *H03M 7/30* (2013.01); *G06F 30/23* (2020.01); *G06T 9/00* (2013.01)

(58) Field of Classification Search
CPC ...... G06F 16/1744; G06F 30/00; G06F 30/22; G06F 30/23; G06T 17/00; G06T 17/20; G06T 9/00; G06T 9/001
See application file for complete search history.

(56) References Cited

U.S. PATENT DOCUMENTS

| | | | | |
|---|---|---|---|---|
| 2013/0117243 A1* | 5/2013 | Carter | ................. | G06F 16/1744 707/693 |
| 2015/0035826 A1* | 2/2015 | Tuffreau | ................... | G06T 1/60 345/420 |

* cited by examiner

*Primary Examiner* — Manuchehr Rahmjoo
(74) *Attorney, Agent, or Firm* — Elie Gendloff; Gendloff IP

(57) ABSTRACT

Disclosed herein is a method for lossless compression and regeneration of digital design data in a manner maintaining the native formats outputted by modeling software used with prime focus on reduction in file size, portability, interchangeability of file storage format and providing database management functions while being implemented as a plug-and-play add-on utility to existing modeling software. Feature-based extraction of design attributes serves as a core of this inventive method and software utility based thereon.

7 Claims, 5 Drawing Sheets

METHOD FOR LOSSLESS COMPRESSION AND REGENERATION OF DIGITAL DESIGN DATA

CROSS REFERENCES TO RELATED APPLICATIONS

None.

TECHNICAL FIELD OF THE INVENTION

The present invention relates generally to data compression and more particularly to a method for lossless compression and regeneration of digital design data in a manner maintaining the native formats outputted by modeling software used with prime focus on reduction in file size, portability, interchangeability of file storage format and providing database management functions while being implemented as a plug-and-play add-on utility to existing modeling software.

BACKGROUND OF THE INVENTION & DESCRIPTION OF RELATED ART

Digital data processing applications, such as computer-aided design (CAD) and similar graphics programs are commonly observed to generate large volumes of data. Collaborative and networking work environments of today often mandate sharing of such data across electronic mail and similar file-sharing utilities. CAD programs, in particular, are found to output files the size of which are prohibitively high to encumber storage and sending via electronic mailing systems. It would therefore be desirable to have some means that allow conversion of these bulky files to some 'lightweight' format which not only makes it easier to store and send via email, but also lends itself more easily to high-speed but less memory-intensive loading for interactive visualization, markup, mockup, styling and analysis operations.

It would be critically essential, in the above requirement for file size reduction, that the compact lightweight files are generated with capacity of regeneration without debilitative loss of performance during regeneration. It would be an added advantage that any approach in this context also provides for securing the data being compressed, or alternatively provides for establishment of an exclusive file format which is rendered accessible to preexisting digital data processing applications such as CAD programs via simple means such as an add-on utility or an extension to the said applications.

Prior art, to the extent studied, bears scattered references to address the wants voiced hereinabove. For example, U.S. Pat. No. 8,370,398 (issued to Siemens Product Lifecycle Management Software Inc) discloses a method whereby the size of lightweight JT data files containing CAD data is reduced by employing lossy compression where acceptable for portions of the CAD data, such as 3D geometry data. Dictionary-based lossless compression for the remaining portions is augmented by exploiting common repeated structures for some portions, such as precise Brep data, and compressing separate but similar data, such as all metadata for a given part and all scene graph data, together as a single block. The compressed data is then written in separate, uniquely identified data segments indexed in a table of contents, allowing quick access to any data segment for streaming. However, this method focuses on creation of lightweight data that can be used in rendering, presentation, annotation purposes rather than disk storage or transit. This method also mandates grouping of CAD data prior to compression and having a table of contents for decompression rather than feature-based processing without requirement of any ad-hoc indexing which would be more logical for quick decompression. Also, this reference is silent on processing of digital design data in batch modules.

Another reference, U.S. Pat. No. 6,480,124 (issued to NEC Corporation) discloses a CAD data compressing method which begins with generating a component figure list, generating data of a common pattern group composed of a plurality of basic figures common among a plurality of pattern groups which are regularly repeated corresponding to the users operation of the input device, and generating data containing a pointer to a component figure corresponding to the pattern identified. Storage format further comprises representing number of repetition times by a predetermined number of bits. For an isolated pattern that is not repeated, an identifier that identifies whether the isolated pattern is a component figure, a single figure that is not registered with a component figure list, or a pattern group composed of a plurality of figures is added. Thus, data can be correctly decompressed. However, this method overly relies on generation of pattern group data rather than feature-specific processing which provides but for less-than-desired speed and accuracy of regeneration.

Yet another reference, EP2833326 (issued to Dassault Systémes) discloses a computer-implemented method for compressing a three-dimensional modeled object. The method comprises: providing (S10) a mesh of the three-dimensional modeled object; parameterizing (u,v) the mesh in a two-dimensional plane, the parameterization of the mesh resulting in a set of vertices having two-dimensional coordinates; providing a grid on the two-dimensional plane; and modifying the two-dimensional coordinates of each vertex by assigning one vertex to one intersection of the grid. Such compression method is lossless, completely reversible, suitable to efficiently reduce the storage size of a CAD file. However, this method is based on use of a 2D mesh and moreover silent on the extent of compression actually achieved, thereby implying additional requirement of processing and therefore slower regenerative compression.

State of the art, represented by the foregoing background references, does not list a single effective solution embracing all considerations voiced hereinabove. This has preserved an acute necessity-to-invent for the present inventor, who therefore as result of his focused research, has come up with novel solutions for resolving all needs of the art once and for all.

A better understanding of the objects, advantages, features, properties and relationships of the present invention will be obtained from the following detailed description which sets forth an illustrative yet-preferred embodiment.

OBJECTIVES OF THE PRESENT INVENTION

The present invention is identified in addressing all major, if not all, deficiencies mentioned in the foregoing section by effectively achieving the objectives stated under, among which:

It is a primary objective of the present invention to provide, for use in connection with a computer aided design application, a method and utility based thereon for outputting a lightweight file format for computer aided design data having its total size reduced by employing feature-based lossless compression.

It is another objective of the present invention further to the aforesaid objective(s) that the method and utility based thereon so provided are capable of regenerating the native file format without mandating high load on processing resources nor compromising the quality of regenerated product.

It is another objective of the present invention further to the aforesaid objective(s) that the method and utility based thereon so provided are capable of severable paired existence for execution of complementary routines for compression and regeneration of digital design data.

It is another objective of the present invention further to the aforesaid objective(s) that the method and utility based thereon so provided results in an exclusive file format and/or includes some means of security that renders compressed files inaccessible other than the specific paired utilities for compression and regeneration.

It is another objective of the present invention further to the aforesaid objective(s) that the method and utility based thereon so provided are capable of compressing/modifying files generated by modeling software such as SolidWorks and CAD which allow feature generation in solid as well as in surface formats.

It is another objective of the present invention further to the aforesaid objective(s) that the method and utility based thereon so provided are capable of compression of at least 50% to 95% of the native CAD data.

It is another objective of the present invention further to the aforesaid objective(s) that the method and utility based thereon so provided are easy to use by even a modestly-skilled person in the art.

It is another objective of the present invention further to the aforesaid objective(s) that the method and utility based thereon so provided are compatible with most versions of pre-existing design and modelling software.

It is another objective of the present invention further to the aforesaid objective(s) that the regenerated CAD Part file has lesser file size than that of original CAD file by optimizing the process of creation of part keeping the number of features same as that of original part.

It is another objective of the present invention further to the aforesaid objective(s) that the colour scheme, material properties, orientation of the CAD Part file are maintained after regeneration in native CAD format.

It is another objective of the present invention further to the aforesaid objective(s) that the developed algorithm can be used efficiently for accessing the CAD part file in lower version of modelling software such as Solid Works and Native CAD software.

It is another objective of the present invention further to the aforesaid objective(s) that the manner of implementation provided is within ambit of even an ordinarily skilled person accustomed to using digital design software.

These and other objectives and their attainment will become apparent to the reader upon the detailed disclosures and drawings to follow, specifically as captured in the appended claims.

BRIEF DESCRIPTION OF DRAWINGS

The present invention is explained herein under with reference to the following drawings, in which.

Figure 1:
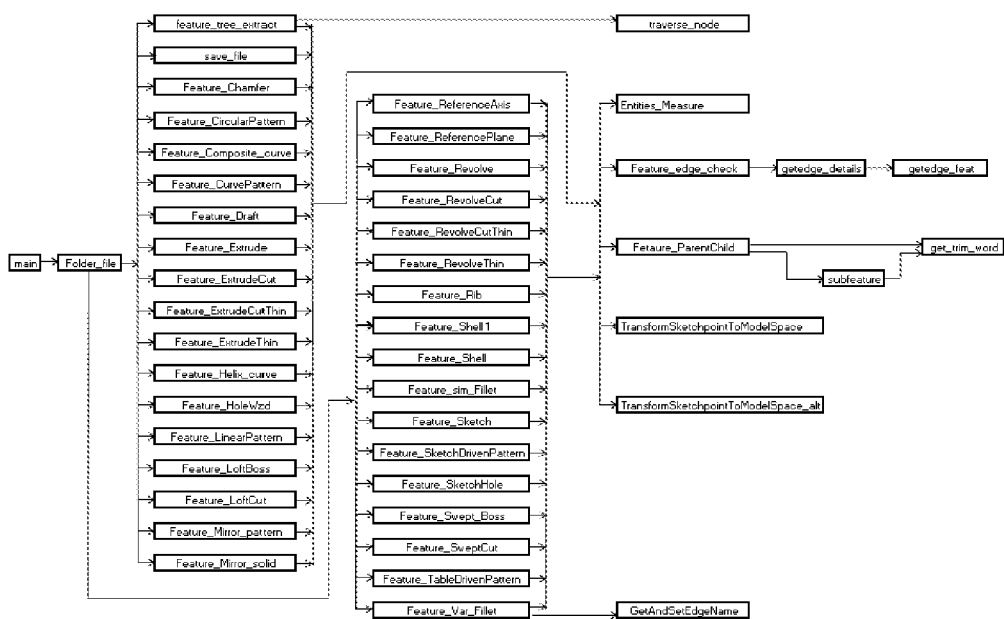
FIG. 1 is a block diagram explaining the logic behind implementation of the routine for compression as provided in the preferred embodiment of the present invention.

In above drawings, wherever possible, the same references and symbols have been used throughout to refer to the same or similar parts. References made to particular examples and implementations are for illustrative purposes, and are not intended to limit the scope of the invention or the claims. Though numbering has been introduced to demarcate reference to specific components in relation to such references being made in different sections of this specification, all components are not shown or numbered in each drawing to avoid obscuring the invention proposed.

The foregoing narration has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the Detailed Description of the invention below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect, with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, and those of ordinary skill in the art will understand that such definitions apply in many, if not most, instances to prior as well as future uses of such defined words and phrases.

DETAILED DESCRIPTION OF THE PRESENT INVENTION

Principally, general purpose of the present invention is to assess disabilities and shortcomings inherent to known systems comprising state of the art and develop new systems incorporating all available advantages of known art and none of its disadvantages. Accordingly, the disclosures herein are directed towards a method and software utility based thereon for lossless compression and regeneration of digital design data in a manner maintaining the native formats outputted by modeling software used with prime focus on reduction in file size, portability, interchangeability of file storage format and providing database management functions while being implemented as a plug-and-play add-on utility to existing modeling software At outset, the present invention achieves the aforesaid intents by means of two complementary routines, being severally-implementable but mutually complementary algorithms, of which a first algorithm serves to extract feature attributes of solid geometry into an <.ampedv> extension file format while the second algorithm serves to regenerate said <.ampedv> extension file back into the native file format.

Referring to the accompanying FIG. 1, which outlines the logic behind implementation of the routine for compression as provided by the first algorithm introduced hereinabove, it can be seen that once a native CAD file(s) is/are selected to be processed, a first subroutine is initially triggered to map/measure various geometric shapes/design features, that is, parameters including Length, Diameter, Area, Parallelism, Perpendicular, Center distance between Bodies and Entities like Edge, face, Sketch segment/point and so on in the CAD file being processed. A function each is executed for mapping including Chamfer, Circular Pattern, Composite curve, Curve Pattern, Draft, Extrude, Extrude Cut, Extrude Cut Thin, Extrude Thin, Helix curve, Hole, Linear Pattern, Loft, Loft Cut, Mirror pattern, Mirror solid, Reference Axis, Reference Plane, Revolve, Revolve Cut, Revolve Cut Thin, Revolve Thin, Rib, Shell, simple fillet, Sketch, Sketch Pattern, Sketch Hole, Swept, Swept Cut, Table Pattern, Feature Tree data, Variable Fillet are mapped. A second set of routines including the functions edge_check and rib_edge_check are executed to check the edge details and its relationship with underlying Sketchsegments, if any in the CAD file being processed.

With continued reference to the accompanying FIG. 1, it can be seen that after features are mapped/measured, a second subroutine is then triggered for extracting feature definitions including AccessSelections, Extrude Cut Thin direction, Draft Angle and direction, Start and End conditions, Bodies and Entities like edge, face, vertices, plane, DatumAxes, and Sketch segment/point, as applicable for each feature mapped.

With continued reference to the accompanying FIG. 1, it can be seen that after feature data is extracted, a third subroutine is then triggered for obtaining various body parameters for each feature measured including loft, rib and their ParentChild relationships.

With continued reference to the accompanying FIG. 1, it can be seen that after various body parameters are obtained, a fourth subroutine is then available for execution, providing for finalization of extracted data by a discrete function each for obtaining the CAD model or CAD Part file and it's feature details, obtaining the string split by a special character, obtaining the edge name if any else set a new edge name, obtaining Edge details like Start, End, Closed for a particular edge, obtaining the edges for a particular feature based on a predefined criteria, on cumulative of which the native CAD data file(s) are stored in a corresponding plurality of compressed <.ampedv> extension file(s).

With continued reference to the accompanying FIG. 1, a fifth executable subroutine can be seen which provides a user interface and control over execution of the first algorithm described hereinabove. Accordingly, user-assist functions are provided for allowing a user to chose between the options of running the program in file mode or Folder (Batch) mode, save file data, returning the details related to sub feature if any, giving the transformation of Sketchpoint coordinates into Model Space co ordinates, giving the transformation of Model Space co ordinates into Sketchpoint coordinates, traversing through the feature nodes and giving details like Name, Root and so on.

Referring to the accompanying FIG. 2, which outlines the logic behind implementation of the routine/algorithm for decompression as provided by the second algorithm introduced hereinabove, it can be seen that once a <.ampedv> extension file(s) is/are selected to be processed, a first subroutine is triggered for execution wherein successive functions are used to get Edge based on details like Start, End, Closed for a particular edge, then a unique tracking ID is added temporarily to each edge determined before obtaining the Face based on details like Start, End, Closed, Type for a particular face.

Figure 2:
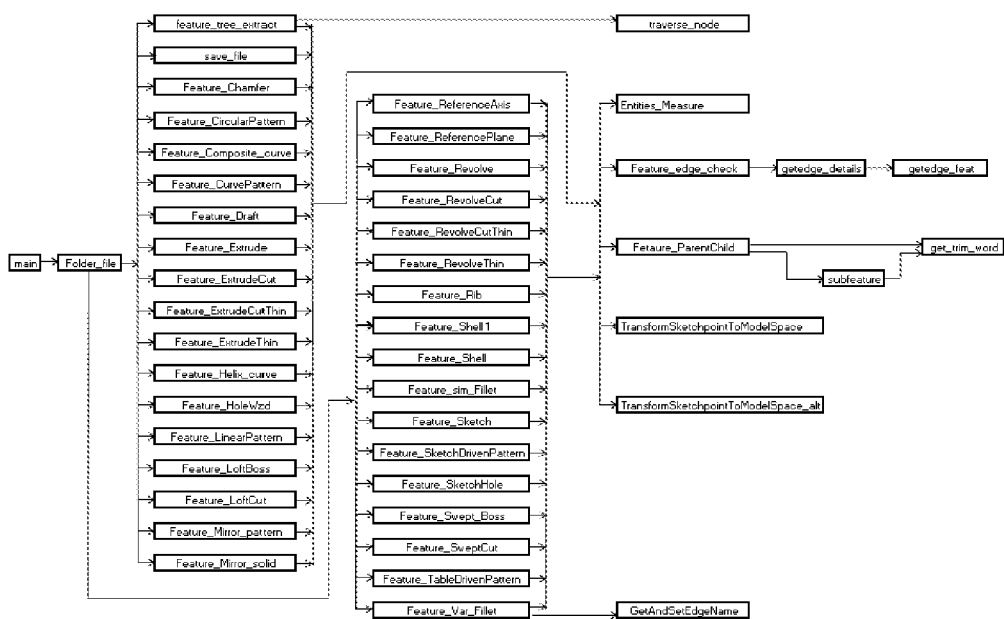
FIG. 2 is a block diagram explaining the logic behind implementation of the routine for decompression as provided in the preferred embodiment of the present invention.
Figure 3A:
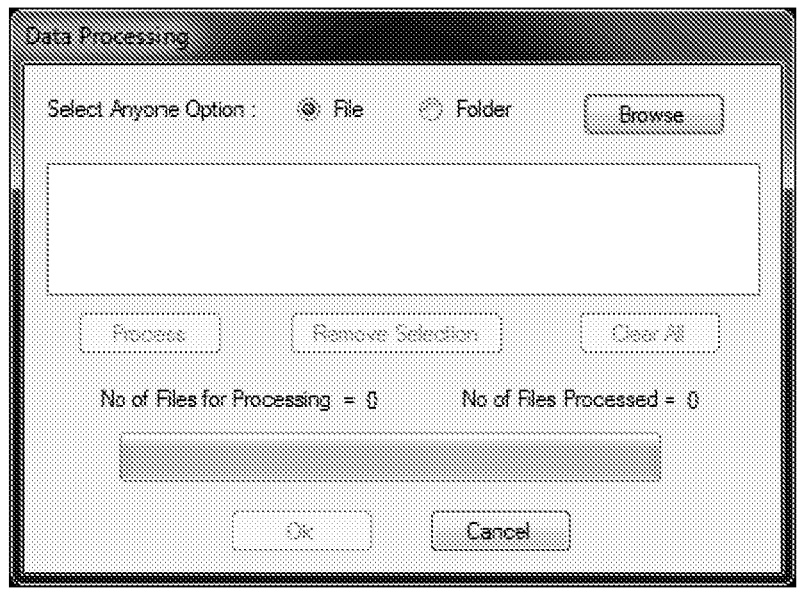
FIGS. 3(*a* through *e*) showcase various successive stages of implementation of the present invention when implemented as a computer-implemented software utility.
Figure 3B:
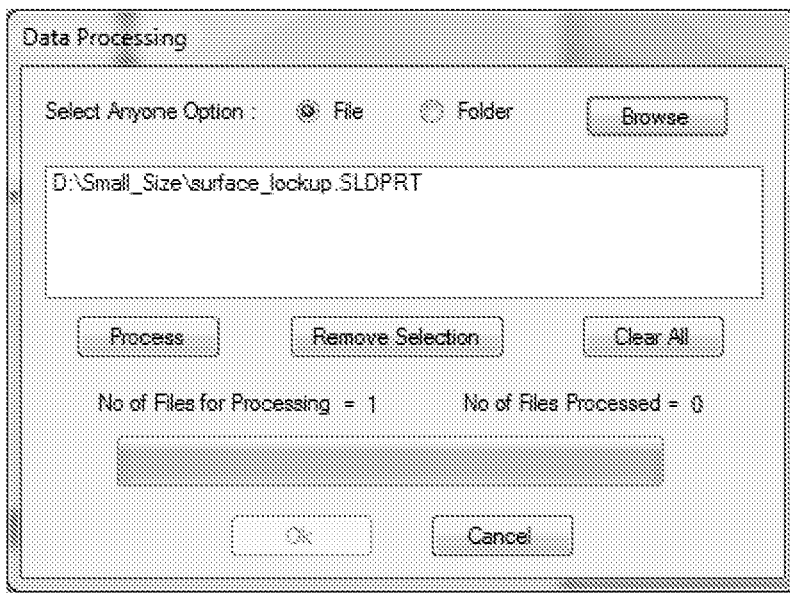
Figure 3C:
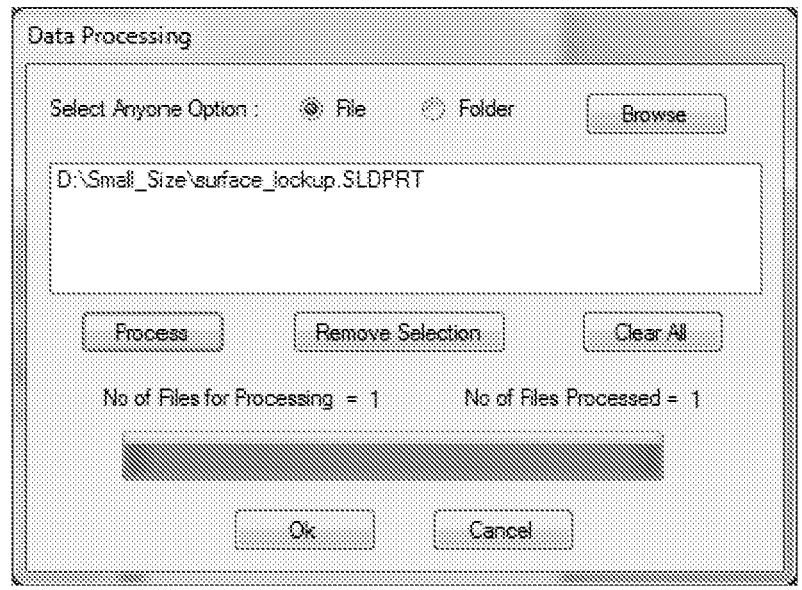
Figure 3D:
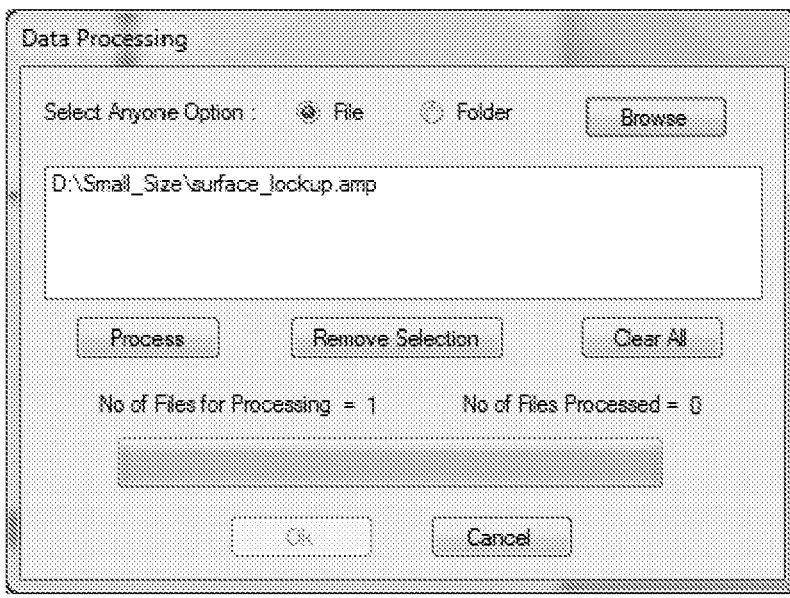
Figure 3E:
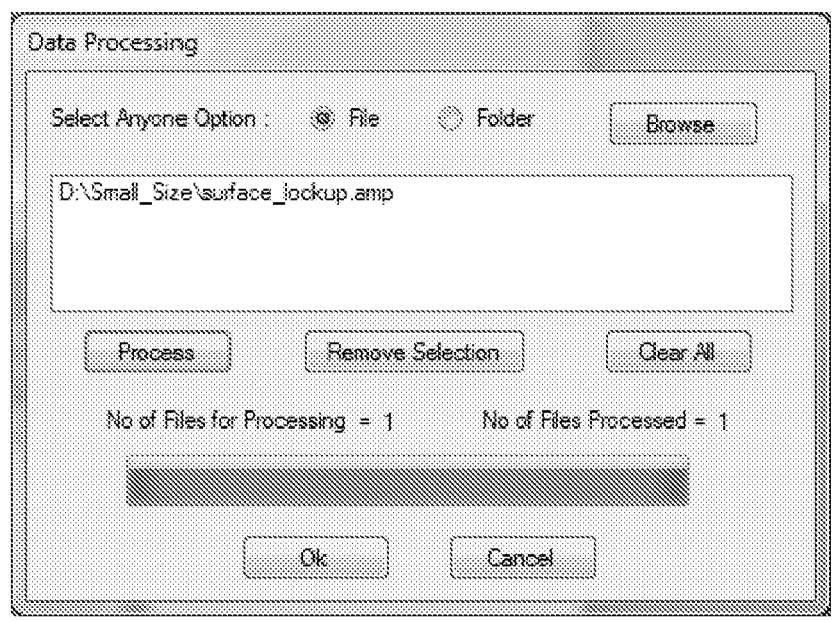

With continued reference to the accompanying FIG. 2, it can be seen that after various edges and constituted faces are determined, a second subroutine is then triggered for creating features based on feature definitions including AccessSelections, Extrude Cut Thin direction, Draft Angle and direction, Start and End conditions, Bodies and Entities like edge, face, vertices, plane, DatumAxes, and Sketch segment/point, as applicable for each feature mapped which are stored in the <.ampedv> extension file(s) under processing. In this manner, a function each is executed for creating features including Chamfer, Circular Pattern, Composite curve, Curve Pattern, Draft, Extrude, Extrude Cut, Extrude Cut Thin, Extrude Thin, Helix curve, Hole, Linear Pattern, Loft, Loft Cut, Mirror pattern, Mirror solid, Reference Axis, Reference Plane, Revolve, Revolve Cut, Revolve Cut Thin, Revolve Thin, Rib, Shell, simple fillet, Sketch, Sketch Pattern, Sketch Hole, Swept, Swept Cut, Table Pattern, Feature Tree data, and Variable Fillet.

With continued reference to the accompanying FIG. 2, it can be seen that after various features are created, a third subroutine is then available for execution, providing for finalization of extracted data by a discrete function each for creating the original model and its features, obtaining the contour used in a particular feature definition, obtaining Edge details like Start, End, Closed for a particular edge, and obtaining the edges for a particular feature based on a predefined criteria, based on which the stored <.ampedv> extension file(s) is/are regenerated to original native CAD data in a lossless manner.

With continued reference to the accompanying FIG. 2, a fifth executable subroutine can be seen which provide the user interface and control over execution of the second algorithm described hereinabove. Accordingly, user-assist functions are provided for allowing a user to chose between the option of running the program in file mode or Folder (Batch) mode, obtaining the plane based on selection data, obtaining the sectional properties for a particular face, obtaining the transformation of Sketchpoint coordinates into Model Space co ordinates, and giving the transformation of Model Space co ordinates into Sketchpoint coordinates.

According to an allied aspect of the present invention, the aforesaid algorithms for compression and regeneration of digital design data exclusively complement each other and hence form an exclusive pair. The digital design data is therefore deemed to be effectively encrypted thereby rendering the compressed files secure against unauthorized access and use.

The present invention has been reduced to practice. Experimental trials have shown at least 50% to 95% lossless compression in file size and accurate regeneration thereafter, thereby consolidating the significant increment over prior art. In combination with other compression agents such as WinZip, an additional 4% reduction in file-size has been observed, marking the true effectiveness of the present invention.

In a typical use case of the present invention to compress a native CAD file, a user is required to start the software utility provided, and select the file(s) to be processed using a file browser. Feature extraction is later automated by execution of the first algorithm described in detail hereinabove, and upon completion of which a visual/sound or equivalent message is conveyed to the user informing of the process execution being concluded and location on disc of the output <.ampedv> file.

Similarly, in the use case of the present invention to decompress a <.ampedv> file, a user is required to start the complementary software utility provided, and select the file(s) to be processed using a file browser. Feature extraction is later automated by execution of the first algorithm described in detail hereinabove, and upon completion of which a visual/sound or equivalent message is conveyed to the user informing of the process execution being concluded and location on disc of the output <.ampedv> file.

Implementation of the present invention is possible in forms chosen among a plug-in as well as a stand-alone applet/software OR in addition to existing file encryption/compression software such as WinZip, which may be accessed either as an offline local installation or cloud-based utility, whereby the user can derive benefit of decreased storage requirements in addition to the capability to send otherwise bulky digital design data over the internet an action previously not possible due to bandwidth/file size restrictions.

As will be readily appreciated by the reader, the aforesaid use-cases and manner of implementation elaborated hereinabove establish a protocol which is natural to any computer-implemented process, and runs without any specific input or user interaction, thereby making it easy to use by even a modestly-skilled person in the art. Capability of batch-processing makes the software utility so provided truly help a user to organize and more-efficiently use storage space, as well as permit sharing of CAD data across electronic communication platforms allowing attachments.

Attention of the reader is now requested to a few illustrious examples which showcase the manner in which the present invention is implemented.

Example 1: Database Architecture of the ampedv Extension File

Table 1 below enlists the database architecture for storing feature tree data.

TABLE 1

| Comments | CommentsFolder | CommentsFolder | FALSE |
|---|---|---|---|
| Favorites | FavoriteFolder | FavoriteFolder | FALSE |
| History | HistoryFolder | HistoryFolder | FALSE |
| Sensors | SensorFolder | SensorFolder | FALSE |
| Design Binder | DocsFolder | DocsFolder | FALSE |
| Annotations | DetailCabinet | DetailCabinet | FALSE |
| Surface Bodies | SurfaceBodyFolder | SurfaceBodyFolder | FALSE |
| Solid Bodies | SolidBodyFolder | SolidBodyFolder | FALSE |

TABLE 1-continued

| Lights, Cameras and Scene | EnvFolder | EnvFolder | FALSE |
|---|---|---|---|
| Equations | EqnFolder | EqnFolder | FALSE |
| Material <not specified> | MaterialFolder | MaterialFolder | FALSE |
| Front Plane | RefPlane | RefPlane | FALSE |
| Top Plane | RefPlane | RefPlane | FALSE |
| Right Plane | RefPlane | RefPlane | FALSE |
| Origin | OriginProfileFeature | OriginProfileFeature | FALSE |
| Sketch1 | ProfileFeature | ProfileFeature | FALSE |
| Boss-Extrude1 | Extrusion | Extrusion | FALSE |
| Sketch2 | ProfileFeature | ProfileFeature | FALSE |
| Cut-Extrude1 | Cut | ICE | FALSE |
| Sketch3 | ProfileFeature | ProfileFeature | FALSE |
| Boss-Extrude2 | Boss | ICE | FALSE |
| Sketch4 | ProfileFeature | ProfileFeature | FALSE |
| Cut-Extrude2 | Cut | ICE | FALSE |
| CirPattern1 | CirPattern | CirPattern | FALSE |
| Point61 | RefPoint | RefPoint | FALSE |

Example 2: Feature Tree Extraction

Table 2 below enlists the data architecture after step of feature tree extraction.

TABLE 2

| Feature Name | Expanded | | | |
|---|---|---|---|---|
| History | FALSE | 20234383 | 1E+29 | 5.39E+08 |
| Sensors | FALSE | 47891719 | 1E+30 | 1.2E+09 |
| Notes Area | FALSE | 28372289 | 1.01E+29 | 6.75E+08 |
| Unassigned Items | FALSE | 54024015 | 1.01E+30 | 1.41E+09 |
| Top | FALSE | 16454088 | 1.01E+28 | 3.74E+08 |
| Front | FALSE | 13869071 | 1E+28 | 3.28E+08 |
| Annotations | FALSE | 57712780 | 1.01E+30 | 1.47E+09 |
| Material <not specified> | FALSE | 49652976 | 1E+30 | 1.23E+09 |
| Front Plane | FALSE | 44223604 | 1E+30 | 1.14E+09 |
| Top Plane | FALSE | 62468121 | 1.1E+30 | 1.65E+09 |
| Right Plane | FALSE | 25342185 | 1E+29 | 6.24E+08 |
| Origin | FALSE | 26753075 | 1E+29 | 6.45E+08 |
| Sketch1 | FALSE | 39451090 | 1.11E+29 | 9.61E+08 |
| Boss-Extrude1 | FALSE | 19515494 | 1.1E+28 | 4.25E+08 |
| (−) Sketch2 | FALSE | 41421720 | 1E+30 | 1.09E+09 |
| Cut-Extrude1 | FALSE | 37251161 | 1.1E+29 | 9.25E+08 |
| Sketch3 | FALSE | 66824994 | 1.1E+30 | 1.72E+09 |
| Boss-Extrude2 | FALSE | 64554036 | 1.1E+30 | 1.68E+09 |
| (−) Sketch4 | FALSE | 44115416 | 1E+30 | 1.14E+09 |
| Cut-Extrude2 | FALSE | 61494432 | 1.1E+30 | 1.63E+09 |
| CirPattern1 | FALSE | 16578980 | 1.01E+28 | 3.75E+08 |

Example 3: Sketch Data Entities

Table 3 below enlists sketch data entities obtained upon execution of the present invention.

TABLE 3

| Reference Plane - SelDATUMPLANES | Points | Text | Circle | Spline | Skecth Relations Data |
|---|---|---|---|---|---|
| Top Plane | 1 | 0 | 1 | 0 | 1 |
| 0 | 0 | | FALSE | | 15 |
| 0 | 0 | | 0 | | 1 |
| 0 | 0 | | 0 | | Arc |
| 1 | 0 | | 0 | | FALSE |
| 0 | 0 | | 0 | | 0.010997505 |
| 0 | 0 | | 0 | | 0 |
| 0 | 0 | | 0 | | −0.003362275 |
| 1 | 2 | | 0.010998 | | 0.010997505 |

TABLE 3-continued

| Reference Plane - SelDATUMPLANES | Points | Text | Circle | Spline | Skecth Relations Data |
|---|---|---|---|---|---|
| 0 | | | 0.003362 | | 0 |
| | | | −0.00336 | | 0.0109975 |
| | | | 0.010998 | | Sketch1 |

Example 4: Graphic User Interface

FIGS. 3(a through e) showcase the manner of implementation of the present invention in which a user may select a native design data file to be processed, authorize its compression as per method of the present invention, and be prompted thereby that the compressed ampedv extension file is ready in matter of a few clicks, which is within ambit of even an ordinarily skilled person accustomed to using digital design software. Same interaction logic applies for decompression of the ampedv extension files created by the software utility provided for implementation of the present invention.

From the foregoing narration, an able method for lossless compression and regeneration of digital design data is thus provided which is unprecedented, and hence incremental to any of its closest peers in state-of-art. As will be realized further, the present invention is capable of various other embodiments and that its several components and related details are capable of various alterations, all without departing from the basic concept of the present invention. Accordingly, the foregoing description will be regarded as illustrative in nature and not restrictive in any form whatsoever. Modifications and variations of the system and apparatus described herein will be obvious to those skilled in the art. Such modifications and variations are intended to come within ambit of the present invention, which is limited only by the appended claims.

We claim:

1. A secure method for lossless compression and regeneration of native computer aided design (CAD) file representing a design, comprising:
    a. executing a severable first routine configured to extract part data from the native CAD file and thereby expressing the extracted data in a private file format having significantly reduced file size; and
    b. executing a severable second routine arranged to complement the first routine and which is configured to receive the private file format expressed by said first routine to thereby regenerate the native CAD file in a lossless manner,
characterized in that:
    the regenerated CAD file has lesser file size than that of original CAD file due to optimization of part creation keeping the number of features same as that of the original parts in the native CAD file;
    colour scheme, material properties, and orientation of parts are maintained after regeneration of the native CAD format;
    the regenerated CAD file is backward compatible with previous versions of CAD software;
    the private file format established is an .ampedvextension file;
    security is introduced by the fact that the private .ampedv extension file established can solely be created, and read, by the first and second subroutines respectively which therefore exclude any instance of unauthorized access, and alternatively use, of said private .ampedv extension file.

2. The secure method for lossless compression and regeneration of native computer aided design (CAD) file representing a design according to claim 1, wherein the severable first routine further comprises:
    a. a first subroutine the execution of which determines geometries present in the input native CAD file and thereafter their measurements including Length, Diameter, Area, Parallelism, Perpendicular, center distance between bodies;
    b. a second subroutine which when executed subsequent to the first subroutine results in extraction of feature definitions as applicable for each geometry mapped;
    c. a third subroutine which when executed subsequent to the second subroutine results indetermination of body parameters including loft, rib and their ParentChild relationships for each feature defined;
    d. a fourth subroutine which when executed post the third subroutine, provides for finalization of extracted data by a discrete function each for obtaining the CAD model or CAD Part file and it's feature details, obtaining the string split by a special character, obtaining the edge name if any else set a new edge name, obtaining Edge details like Start, End, Closed for a particular edge, obtaining the edges for a particular feature based on a user-defined criteria; and
    e. a fifth subroutine configured to provide an user interface for allowing a user to initialize the first routine and thereafter actuate among discrete functions for running the program in file mode or Folder (Batch) mode, save file data in a private file format, returning the details related to sub feature if any, giving the transformation of Sketchpoint coordinates into Model Space coordinates, giving the transformation of Model Space coordinates into Sketchpoint coordinates, traversing through the feature nodes and giving details like Name and Root.

3. The secure method for lossless compression and regeneration of native computer aided design (CAD) file representing a design according to claim 2, wherein the geometries of design in the native CAD file are chosen among edges, faces, vertices, planes, Datum Axes, Sketch segments, and Sketch points.

4. The secure method for lossless compression and regeneration of native computer aided design (CAD) file representing a design according to claim 2, wherein the features of each geometry determined in the native CAD file are selected among Chamfer, Circular Pattern, Composite curve, Curve Pattern, Draft, Extrude, Extrude Cut, Extrude Cut Thin, Extrude Thin, Helix curve, Hole, Linear Pattern, Loft, Loft Cut, Mirror pattern, Mirror solid, Reference Axis, Reference Plane, Revolve, Revolve Cut, Revolve Cut Thin, Revolve Thin, Rib, Shell, simple fillet, Sketch, Sketch Pattern, Sketch Hole, Swept, Swept Cut, Table Pattern, Feature Tree data, and Variable Fillet.

5. The secure method for lossless compression and regeneration of native computer aided design (CAD) file representing a design according to claim 2, wherein the definitions of each feature defined in the native CAD file are selected among amongAccessSelections, Extrude Cut Thin direction, Draft Angle and direction, Start and End conditions, Bodies and Entities like edge, face, vertices, plane, DatumAxes, and Sketch segment, and points.

6. The secure method for lossless compression and regeneration of native computer aided design (CAD) file representing a design according to claim 1, wherein the severable second routine further comprises:
   a. a first subroutine the execution of which results in deciphering the private file format expressed by the first routine to ascertain and uniquely mark geometries present in the native CAD file representing the original design to thereby obtain each Face based on details like Start, End, Closed, Type for a particular face;
   b. a second subroutine which when executed subsequent to the first subroutine results in creation of features based on feature definitions stored in the private file format expressed by the first routine;
   c. a third subroutine which when executed post the second subroutine, provides for finalization of data in the private file format expressed by the first routine by performance of a discrete function each for creating the original model and it's features, obtaining the contour used in a particular feature definition, obtaining Edge details like Start, End, Closed for a particular edge, and obtaining the edges for a particular feature based on a predefined criteria; and
   d. a fourth subroutine configured to provide an user interface for allowing a user to initialize the first routine and thereafter actuate among discrete functions for allowing a user to chose between the option of running the program in file mode or Folder (Batch) mode, obtaining the plane based on selection data, obtaining the sectional properties for a particular face, obtaining the transformation of Sketchpoint coordinates into Model Space coordinates, and giving the transformation of Model Space coordinates into Sketchpoint coordinates.

7. The secure method for lossless compression and regeneration of native computer aided design (CAD) file representing a design according to claim 1, wherein file size of the native CAD file is reduced by 50 to 99% without any compromise in data content thereof.

* * * * *